United States Patent
Yamane et al.

(10) Patent No.: US 8,525,621 B2
(45) Date of Patent: Sep. 3, 2013

(54) BOUNDARY ACOUSTIC WAVE FILTER

(75) Inventors: Takashi Yamane, Yasu (JP); Masaru Yata, Kanazawa (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 265 days.

(21) Appl. No.: 12/398,237

(22) Filed: Mar. 5, 2009

(65) Prior Publication Data

US 2009/0160574 A1    Jun. 25, 2009

Related U.S. Application Data

(63) Continuation of application No. PCT/JP2007/067322, filed on Sep. 5, 2007.

(30) Foreign Application Priority Data

Sep. 25, 2006    (JP) .................................. 2006-259281

(51) Int. Cl.
  *H03H 9/46*    (2006.01)
  *H03H 9/64*    (2006.01)

(52) U.S. Cl.
  USPC ......................................... 333/193; 333/195

(58) Field of Classification Search
  USPC .................................. 333/195, 193
  See application file for complete search history.

(56) References Cited

U.S. PATENT DOCUMENTS

| | | | |
|---|---|---|---|
| 6,853,269 B2* | 2/2005 | Nakamura et al. | 333/193 |
| 7,429,905 B2* | 9/2008 | Shibahara | 333/193 |
| 7,453,184 B2* | 11/2008 | Kando | 310/313 R |
| 2002/0000898 A1 | 1/2002 | Takamine | |
| 2002/0017969 A1 | 2/2002 | Takamine | |
| 2003/0062970 A1* | 4/2003 | Ouchi et al. | 333/195 |
| 2007/0126531 A1* | 6/2007 | Yata | 333/195 |
| 2007/0229194 A1* | 10/2007 | Takamine | 333/195 |

FOREIGN PATENT DOCUMENTS

| | | |
|---|---|---|
| EP | 1 158 672 A2 | 11/2001 |
| JP | 2002-084163 A | 3/2002 |

(Continued)

OTHER PUBLICATIONS

Official Communication issued in International Patent Application No. PCT/JP2007/067322, mailed on Nov. 6, 2007.
Official Communication issued in corresponding Japanese Patent Application No. 2008-536317, mailed on Oct. 19, 2010.

(Continued)

*Primary Examiner* — Dean O Takaoka
*Assistant Examiner* — Alan Wong
(74) *Attorney, Agent, or Firm* — Keating & Bennett, LLP

(57) ABSTRACT

A boundary acoustic wave filter device includes an electrode structure provided at a boundary between a piezoelectric body and a dielectric body laminated on the piezoelectric body and utilizes an SH-type boundary acoustic wave that propagates along the boundary. In the boundary acoustic wave filter device, the electrode structure includes a longitudinally coupled resonator boundary acoustic wave filter portion that has a first IDT and second and third IDTs arranged respectively on both sides of the IDT in a direction in which the boundary acoustic wave propagates. At portions at which two IDTs are located adjacent to each other in the direction in which the boundary acoustic wave propagates, narrow pitch electrode finger portions are provided in the IDTs, and the pitch of the electrode fingers of the narrow pitch electrode finger portion is different from the pitch of the electrode fingers of each of the narrow pitch electrode finger portions.

8 Claims, 7 Drawing Sheets

(56) References Cited

FOREIGN PATENT DOCUMENTS

| JP | 2006-087145 A | | 3/2006 |
|---|---|---|---|
| JP | 2006-254410 A | | 9/2006 |
| WO | WO 2004095699 A1 | * | 11/2004 |
| WO | WO 2006068087 A1 | * | 6/2006 |
| WO | 2006/087875 A1 | | 8/2006 |

OTHER PUBLICATIONS

Official Communication issued in corresponding Japanese Patent Application No. 2008-536317, mailed on Jan. 18, 2011.
Official Communication issued in corresponding German Patent Application No. 11 2007 002 105.5, mailed on Oct. 24, 2011.

* cited by examiner

BOUNDARY ACOUSTIC WAVE FILTER

BACKGROUND OF THE INVENTION

1. Field of the Invention

The present invention relates to a boundary acoustic wave filter device used as, for example, a band-pass filter of a cellular phone, and, more particularly, to a longitudinally coupled resonator boundary acoustic wave filter device including a plurality of IDTs that are arranged in a boundary acoustic wave propagating direction.

2. Description of the Related Art

Surface acoustic wave filter devices are widely used as band-pass filters of cellular phones. For example, Japanese Unexamined Patent Application Publication No. 2006-87145 describes a surface acoustic wave filter device having an electrode structure shown in FIG. 7.

A surface acoustic wave filter device 1001 shown in FIG. 7 includes a piezoelectric substrate 1002. The electrode structure shown in FIG. 7 is arranged on the piezoelectric substrate 1002 so as to define first and second longitudinally coupled resonator surface acoustic wave filter portions 1011 and 1012. In the longitudinally coupled resonator surface acoustic wave filter portion 1011, a first IDT 1014 is arranged in the middle and second and third IDTs 1013 and 1015 are arranged on both sides of the first IDT 1014 in a direction in which a surface acoustic wave propagates. Reflectors 1016 and 1017 are arranged on both sides of the region in which the IDTs 1013 to 1015 are arranged in the direction in which surface acoustic wave propagates.

Similarly, in the second longitudinally coupled resonator surface acoustic wave filter portion 1012, a first IDT 1019 is arranged in the middle and second and third IDTs 1018 and 1020 are arranged on both sides of the first IDT 1019 in a direction in which a surface acoustic wave propagates. Reflectors 1021 and 1022 are arranged on both sides of the region in which the IDTs 1018 to 1020 are provided. An input terminal is connected to one end of the first IDT 1014 of the first longitudinally coupled resonator surface acoustic wave filter portion 1011. An end of the IDTs 1013 and 1015 are respectively connected to an end of the second and third IDTs 1018 and 1020 of the second longitudinally coupled resonator surface acoustic wave filter portion 1012 through signal lines. One end of the middle first IDT 1019 of the second longitudinally coupled resonator surface acoustic wave filter portion 1012 is connected to an output terminal. Ends opposite to the ends of the IDTs 1013 to 1015 and IDTs 1018 to 1020, to which the input terminal, output terminal and signal lines are connected, are all connected to a ground.

In the IDTs 1013 to 1015 and IDTs 1018 to 1020 of the surface acoustic wave filter device 1001, a narrow pitch electrode finger portion is provided in each IDT at a portion at which two IDTs are located adjacent to each other in the direction in which a surface acoustic wave propagates. For example, in the IDT 1013, a portion of the IDT 1013 including an electrode finger 1013a located at an end adjacent to the IDT 1014 and an electrode finger 1013b located next to the electrode finger 1013a has a relatively narrow pitch. In this manner, the narrow pitch electrode finger portion is provided. The electrode finger pitch of the narrow pitch electrode finger portion is less than the electrode finger pitch of the electrode finger portion of the IDT 1013 other than the narrow pitch electrode finger portion.

In the longitudinally coupled resonator surface acoustic wave filter device 1001, because the narrow pitch electrode finger portion is provided in each IDT at the portion at which two IDTs are located adjacent to each other, an insertion loss can be reduced in a pass band.

Recently, a boundary acoustic wave filter device that utilizes a boundary acoustic wave that propagates along a boundary between two media having different acoustic velocities has been used. An electrode structure of the boundary acoustic wave device may appropriately utilize the electrode structure of the surface acoustic wave filter device.

When the boundary acoustic wave filter device includes an electrode structure that is similar to that of the longitudinally coupled resonator surface acoustic wave filter device described in Japanese Unexamined Patent Application Publication No. 2006-87145, an insertion loss in a pass band may be reduced by providing the narrow pitch electrode finger portions. However, a large spurious response tends to occur in a frequency band that is higher than the pass band. Thus, the boundary acoustic wave filter device cannot be used for applications in which the occurrence of a spurious response in a band higher than the pass band is unfavorable.

SUMMARY OF THE INVENTION

To overcome the problems described above, preferred embodiments of the present invention provide a longitudinally coupled resonator boundary acoustic wave filter device that not only reduces an insertion loss in a pass band by providing a narrow pitch electrode finger portion but also effectively reduces an undesirable spurious response in a frequency band that is higher than the pass band.

According to a first preferred embodiment of the present invention, a boundary acoustic wave filter device includes a piezoelectric body, a dielectric body laminated on the piezoelectric body, and an electrode structure arranged at a boundary between the piezoelectric body and the dielectric body, wherein the boundary acoustic wave filter device utilizes an SH-type boundary acoustic wave that propagates along the boundary. The electrode structure includes a first IDT, and second and third IDTs that are arranged on both sides of the first IDT in a direction in which the boundary acoustic wave propagates, whereby a longitudinally coupled resonator boundary acoustic wave filter portion is provided, wherein in the first to third IDTs, in a region in which two IDTs are located adjacent to each other, the electrode finger pitch of a portion of electrode fingers of one IDT, located at an end adjacent to the other IDT, is less than the electrode finger pitch of a portion of electrode fingers of the one IDT, adjacent to that portion, whereby a narrow pitch electrode finger portion is provided, and wherein the electrode finger pitch of the electrode fingers of at least one of the narrow pitch electrode finger portions provided in the first IDT and the second and third IDTs is different from the electrode finger pitch of the electrode finger portions of each of the remaining narrow pitch electrode finger portions.

According to a second preferred embodiment of the present invention, a boundary acoustic wave filter device includes a piezoelectric body, a dielectric body laminated on the piezoelectric body, and an electrode structure arranged at a boundary between the piezoelectric body and the dielectric body. The boundary acoustic wave filter device utilizes an SH-type boundary acoustic wave that propagates along the boundary, wherein the electrode structure includes first and second longitudinally coupled resonator filter portions, each of which includes a first IDT, and second and third IDTs that are arranged on both sides of the first IDT in a direction in which the boundary acoustic wave propagates, wherein at portions of the first to third IDTs, at which two IDTs are located adjacent to each other, the pitch of a portion of electrode fingers of one IDT, located at an end adjacent to the other IDT, is less than the pitch of another portion of electrode fingers of the one IDT, adjacent to that portion, whereby a narrow pitch electrode finger portion is provided, wherein the polarity of each of the first to third IDTs of the first and second longitudinally coupled resonator boundary acoustic wave filter portions is selected such that the phase of an output signal to an input signal of the second longitudinally coupled resonator boundary acoustic wave filter portion is different by about 180 degrees from the phase of an output signal to an input signal of the first longitudinally coupled resonator boundary acoustic wave filter portion, wherein an unbalanced terminal and first and second balanced terminals are provided, input ends of the first and second longitudinally coupled resonator boundary acoustic wave filter portions are connected to the unbalanced terminal, and output ends of the first and second longitudinally coupled resonator boundary acoustic wave filter portions are respectively connected to the first and second balanced terminals, and wherein the pitch of the electrode fingers of at least one of the narrow pitch electrode finger portions of the first IDT and the second and third IDTs is different from the pitch of the electrode finger portions of each of the remaining narrow pitch electrode finger portions.

According to a third preferred embodiment of the present invention, a boundary acoustic wave filter device includes a piezoelectric body, a dielectric body laminated on the piezoelectric body, and an electrode structure arranged at a boundary between the piezoelectric body and the dielectric body, wherein the boundary acoustic wave filter device utilizes an SH-type boundary acoustic wave that propagates along the boundary. The electrode structure includes first and second longitudinally coupled resonator filter portions, each of which includes a first IDT, and second and third IDTs that are arranged on both sides of the first IDT in a direction in which the boundary acoustic wave propagates, wherein at portions of the first to third IDTs, at which two IDTs are located adjacent to each other, the pitch of a portion of electrode fingers of one IDT, located at an end adjacent to the other IDT, is less than the pitch of another portion of electrode fingers of the one IDT, adjacent to that portion, whereby a narrow pitch electrode finger portion is provided, wherein the polarity of each of the first to third IDTs of the first and second longitudinally coupled resonator boundary acoustic wave filter portions is selected such that the phase of an output signal to an input signal of the second longitudinally coupled resonator boundary acoustic wave filter portion is different by about 180 degrees from the phase of an output signal to an input signal of the first longitudinally coupled resonator boundary acoustic wave filter portion, wherein an unbalanced terminal and first and second balanced terminals are provided, input ends of the first and second longitudinally coupled resonator boundary acoustic wave filter portions are connected to the unbalanced terminal, and output ends of the first and second longitudinally coupled resonator boundary acoustic wave filter portions are connected to the first and second balanced terminals, wherein the pitches of the electrode fingers of the narrow pitch electrode finger portions of the first to third IDTs in the first longitudinally coupled resonator filter portion are equal or substantially equal to one another, wherein the pitches of the electrode fingers of the narrow pitch electrode finger portions of the first to third IDTs in the second longitudinally coupled resonator filter portion are equal or substantially equal to one another, and wherein the pitch of the electrode fingers of each of the narrow pitch electrode finger portions of the first to third IDTs in the first longitudinally coupled resonator filter portion is different from the pitch of the electrode fingers of each of the narrow pitch electrode finger portions of the first to third IDTs in the second longitudinally coupled resonator filter portion.

In the boundary acoustic wave filter device according to the second or third preferred embodiment, the boundary acoustic wave filter device preferably further includes third and fifth longitudinally coupled resonator boundary acoustic wave filter portions that are configured the same or substantially the same as the first longitudinally coupled resonator boundary acoustic wave filter portion, and fourth and sixth longitudinally coupled resonator boundary acoustic wave filter portions that are configured the same or substantially the same as the second longitudinally coupled resonator boundary acoustic wave filter portion, wherein input ends of the first to sixth longitudinally coupled resonator boundary acoustic wave filter portions are connected to the unbalanced terminal, output ends of the first, third and fifth longitudinally coupled resonator boundary acoustic wave filter portions are connected to the first balanced terminal, and output ends of the second, fourth and sixth longitudinally coupled resonator boundary acoustic wave filter portions are connected to the second balanced terminal. In this case, because the third and fifth longitudinally coupled resonator boundary acoustic wave filter portions are connected in parallel with the first longitudinally coupled resonator boundary acoustic wave filter portion, and the fourth and sixth longitudinally coupled resonator boundary acoustic wave filter portions are connected in parallel with the second longitudinally coupled resonator boundary acoustic wave filter portion, a boundary acoustic wave filter device is provided which has enhanced power withstanding capability with less loss.

In the boundary acoustic wave filter device according to the first or second preferred embodiment, preferably, the number of electrode fingers of each of the narrow pitch electrode finger portions of the first IDT is different from the number of electrode fingers of each of the narrow pitch electrode finger portions of the second and third IDTs. In this case, by adjusting the number of electrode fingers of each IDT, unwanted spurious responses are effectively prevented.

The boundary acoustic wave filter device according to a preferred embodiment of the present invention may preferably further include fourth and fifth IDTs, the fourth and fifth IDTs being arranged on both sides of the region in which the first to third IDTs are provided, in the direction in which the boundary acoustic wave propagates, whereby a five-IDT type longitudinally coupled resonator boundary acoustic wave filter portion is provided. Thus, a boundary acoustic wave filter device is provided which has further enhanced power withstanding capability with less loss.

In the boundary acoustic wave filter device according to the first preferred embodiment, because the narrow pitch electrode finger portions are provided in the first to third IDTs, an insertion loss within the pass band is reduced. In addition, because, the pitch of at least one of the narrow pitch electrode finger portions is different from the pitch of the electrode fingers of each of the remaining narrow pitch electrode finger portions, the influence of the at least one of the narrow pitch electrode finger portions on the filter characteristic is different from the influence of the remaining narrow pitch electrode finger portions on the filter characteristic. Thus, an undesirable spurious response that occurs in a band higher than the pass band is reduced.

Similarly, according to the second preferred embodiment, because each of the first and second longitudinally coupled resonator boundary acoustic wave filter portions has first to third IDTs, an insertion loss in the pass band is reduced. In addition, the pitch of at least one of the narrow pitch electrode finger portions is different from the pitch of the electrode fingers of each of the remaining narrow pitch electrode finger portions. Thus, an undesirable spurious response that occurs in a band higher than the pass band is reduced.

In the first and second preferred embodiments, the reason that a high band side spurious response is suppressed in such a manner that the pitch of the electrode fingers of at least one of the narrow pitch electrode finger portions of the first to third IDTs is different from the pitch of the remaining narrow pitch electrode finger portions may be as follows. In the boundary acoustic wave filter device that utilizes an SH-type boundary acoustic wave, a cut angle of the piezoelectric body and a normalized thickness of an IDT (=(IDT thickness/IDT wavelength)) are usually set in a range in which the electromechanical coefficient for a Stoneley wave that causes a spurious response is small. On the other hand, the thickness of each IDT is the same or substantially the same. Thus, even when the narrow pitch electrode finger portions are provided, the thickness of each narrow pitch electrode finger portion is usually the same or substantially the same as the remaining portions of the IDTs. As a result, the normalized thickness of the narrow pitch electrode finger portion shifts from a range in which the electromechanical coefficient for a Stoneley wave is relatively small in a direction in which the normalized thickness increases. Thus, in the narrow pitch electrode finger portion, the excited Stoneley wave is received at a particular strength, such that the above described spurious response occurs in a frequency band higher than the pass band.

In contrast, in the first and second preferred embodiments of the present invention, because the pitch of the electrode fingers of at least one of the narrow pitch electrode finger portions is different from the pitch of the electrode fingers of each of the remaining narrow pitch electrode finger portions, the frequency band of an excited Stoneley wave received by the at least one of the narrow pitch electrode finger portions is shifted from a frequency band of an excited Stoneley wave received by the remaining narrow pitch electrode finger portions. Thus, a spurious response that occurs in a band higher than the pass band is dispersed and thus, the spurious response is reduced.

Therefore, according to the first and second preferred embodiments of the present invention, it is possible to suppress a spurious response in a frequency band higher than the pass band. Thus, it is possible to provide a boundary acoustic wave filter device that is suitable for applications in which the occurrence of a large spurious response in a band higher than the pass band is unfavorable.

In the boundary acoustic wave filter device according to the third preferred embodiment of the present invention, in a configuration in which the balance-unbalance conversion function is provided and the first and second longitudinally coupled resonator filter portions are connected to the first and second balanced terminals, the pitch of the electrode fingers of each of the narrow pitch electrode finger portions of the first to third IDTs in the first longitudinally coupled resonator filter portion is different from the pitch of the electrode fingers of each of the narrow pitch electrode finger portions of the first to third IDTs in the second longitudinally coupled resonator filter portion. Thus, it is possible to reduce an undesirable spurious response that appears in a band higher than the pass band. That is, the influence of the narrow pitch electrode finger portions of the first longitudinally coupled resonator filter portion on the filter characteristic is different from the influence of the narrow pitch electrode finger portions of the second longitudinally coupled resonator filter portion on the filter characteristic, such that it is possible to disperse a spurious response in a high band side so as to reduce the high-band side spurious response.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, specific preferred embodiments of the present invention will be described with reference to the accompanying drawings.

Figure 1:
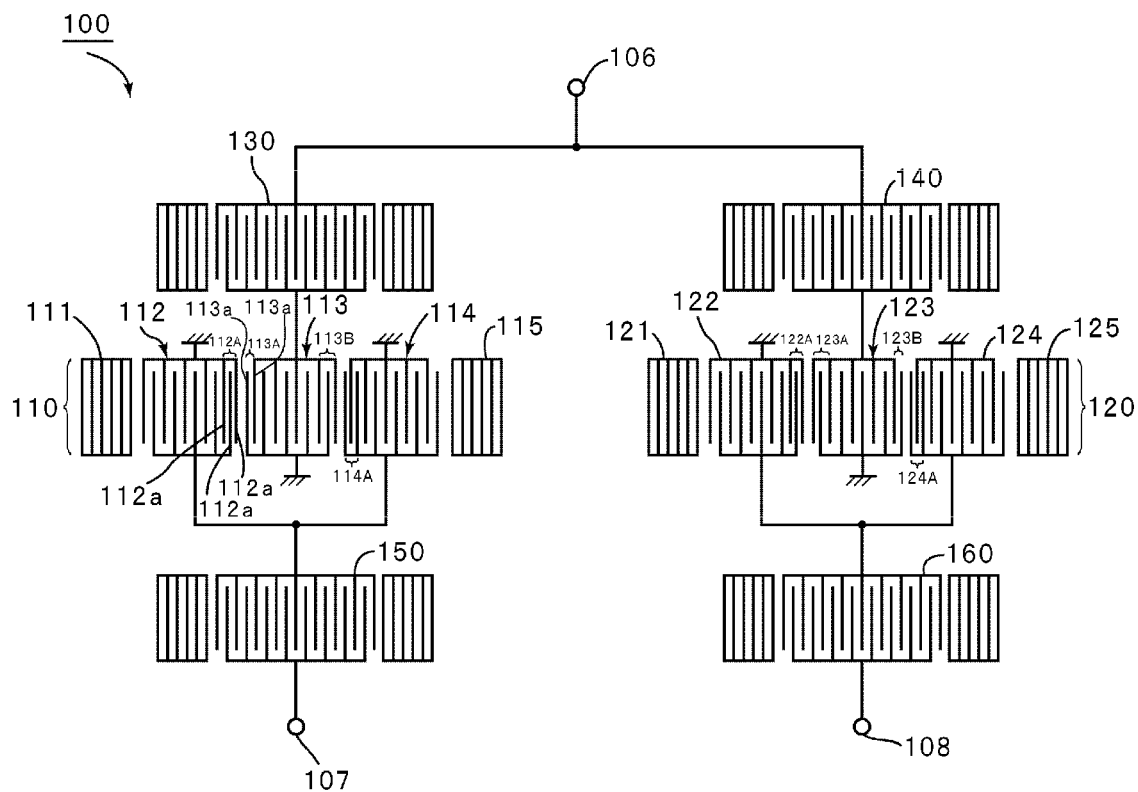
FIG. 1 is a schematic plan view that shows the electrode structure of a boundary acoustic wave filter device according to a first preferred embodiment of the present invention.
Figure 2:
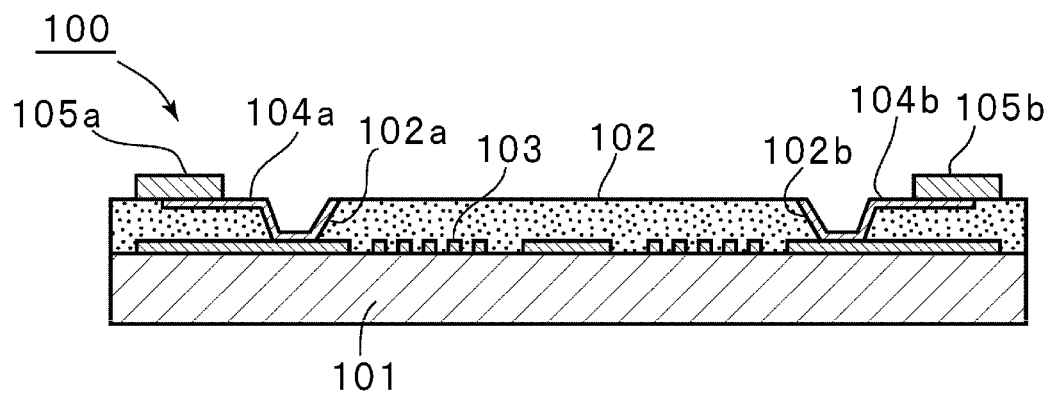
FIG. 2 is a schematic front cross-sectional view of the boundary acoustic wave filter device according to the first preferred embodiment of the present invention.

FIG. 1 is a schematic plan view that shows the electrode structure of a longitudinally coupled resonator boundary acoustic wave filter device according to a first preferred embodiment of the present invention. FIG. 2 is a schematic front cross-sectional view of the boundary acoustic wave filter device.

As shown in FIG. 2, the boundary acoustic wave filter device 100 includes a piezoelectric substrate 101 made of $LiNbO_3$ having a principal plane obtained by rotating the Y-axis through about 15 degrees +−10 degrees. A dielectric body 102 is laminated on the piezoelectric substrate 101. In the present preferred embodiment, the dielectric body 102 is preferably made of silicon oxide, for example. The silicon oxide may preferably include $SiO_2$, for example. However, the dielectric body 102 may preferably be made of another dielectric body material other than silicon oxide, such as silicon nitride, for example.

An electrode structure 103 is provided at a boundary between the piezoelectric substrate 101 and the dielectric body 102. The electrode structure 103 is schematically shown in FIG. 1.

As shown in FIG. 2, the dielectric body 102 is provided with a plurality of openings 102a and 102b. A portion of the electrode structure 103 is exposed at the openings 102a and 102b. Then, conductive patterns 104a and 104b are provided at the openings 102a and 102b. The conductive patterns 104a and 104b are electrically connected to the electrode structure that is exposed in the opening, and extend onto the upper surface of the dielectric body 102 outside the openings. Then, the conductive patterns 104a and 104b are electrically connected to the external electrodes 105a and 105b, respectively. The external electrodes 105a and 105b correspond to terminals that are connected to an unbalanced terminal, a balanced terminal, which will be described later, or a ground.

The boundary acoustic wave filter device 100 is preferably a longitudinally coupled resonator boundary acoustic wave filter device that utilizes an SH-type boundary acoustic wave, which propagates along a boundary between the piezoelectric substrate 101 and the dielectric body 102.

The boundary acoustic wave filter device 100 is preferably used as a GSM 1900 MHz band receiving filter having a pass band of about 1930 MHz to about 1990 MHz, for example.

As shown in FIG. 1, the boundary acoustic wave filter device 100 includes the illustrated electrode structure between an unbalanced terminal 106 and first and second balanced terminals 107 and 108.

A first longitudinally coupled resonator boundary acoustic wave filter portion 110 is connected to the unbalanced terminal 106 via a one-port boundary acoustic wave resonator 130. In addition, the first longitudinally coupled resonator boundary acoustic wave filter portion 110 is connected to the first balanced terminal 107 via a one-port boundary acoustic wave resonator 150.

Each of the one-port boundary acoustic wave resonators 130 and 150 includes an IDT and reflectors arranged on both sides of the IDT in a boundary acoustic wave propagating direction in which a boundary acoustic wave propagates.

On the other hand, the first longitudinally coupled resonator boundary acoustic wave filter portion 110 includes a first IDT 113, second and third IDTs 112 and 114, and reflectors 111 and 115. The first IDT 113 is arranged in the middle. The second and third IDTs 112 and 114 are arranged on both sides of the first IDT 113 in the boundary acoustic wave propagating direction. The reflectors 111 and 115 are arranged on both sides of the region in which the first to third IDTs 113, 112, and 114 are arranged in the boundary acoustic wave propagating direction.

The longitudinally coupled resonator boundary acoustic wave filter portion 110 is preferably the three-IDT type longitudinally coupled resonator filter described above. At a portion at which the first and second IDTs 112 and 113 are located adjacent to each other and at a portion at which the first and third IDTs 113 and 114 are located adjacent to each other, each of the IDTs 112 to 114 includes a narrow pitch electrode finger portion.

That is, the electrode finger pitch of a portion of an end of the second IDT 112 adjacent to the first IDT 113 at which a plurality of electrode fingers 112a are provided defines a narrow pitch electrode finger portion 112A having a reduced pitch of the electrode fingers. The electrode finger pitch of the electrode fingers of the narrow pitch electrode finger portion 112A is less than the electrode finger pitch of the remaining portion of the IDT 112, adjacent to the narrow pitch electrode finger portion 112A.

On the other hand, a narrow pitch electrode finger portion 113A is provided at an end of the first IDT 113, adjacent to the second IDT 112. The narrow pitch electrode finger portion 113A includes a plurality of electrode fingers 113a. The electrode finger pitch of the electrode fingers of the narrow pitch electrode finger portion 113A is less than the electrode finger pitch of the IDT 113, adjacent to the narrow pitch electrode finger portion 113A. Note that a narrow pitch electrode finger portion 113B is also provided in the first IDT 113 adjacent to the third IDT 114.

In the first longitudinally coupled resonator boundary acoustic wave filter portion, the narrow pitch electrode finger portions 112A, 113A, 113B and 114A are provided in the IDTs 112 to 114.

In the present preferred embodiment, the electrode finger pitch of each of the narrow pitch electrode finger portions 112A, 113A, 113B and 114A of the first longitudinally coupled resonator boundary acoustic wave filter portion 110 is less than the electrode finger pitch of each of narrow pitch electrode finger portions 122A, 123A, 123B and 124A of a second longitudinally coupled resonator boundary acoustic wave filter portion 120.

As shown in FIG. 1, the second longitudinally coupled resonator boundary acoustic wave filter portion 120 is connected to the unbalanced terminal 106 via a one-port boundary acoustic wave resonator 140. In addition, the second longitudinally coupled resonator boundary acoustic wave filter portion 120 is connected to the second balanced terminal 108 via a one-port boundary acoustic wave resonator 160.

The one-port boundary acoustic wave resonators 140 and 160 are similar to the one-port boundary acoustic wave resonators 130 and 150.

The second longitudinally coupled resonator boundary acoustic wave filter portion 120 includes a first IDT 123, second and third IDTs 122 and 124, and reflectors 121 and 125. The first IDT 123 is arranged in the middle. The second and third IDTs 122 and 124 are arranged on both sides of the first IDT 123 in boundary acoustic wave propagating direction.

The second longitudinally coupled resonator boundary acoustic wave filter portion 120 is similar to the first longitudinally coupled resonator boundary acoustic wave filter portion 110, except that the polarity of the middle first IDT 123 is opposite to the polarity of the first IDT 113. That is, in the second longitudinally coupled resonator boundary acoustic wave filter portion 120, at a portion at which the first and second IDTs 123 and 122 are located adjacent to each other and at a portion at which the first and third IDTs 123 and 124 are located adjacent to each other, narrow pitch electrode finger portions 122A, 123A, 123B, and 124A are provided in the IDTs 122 to 124.

In the longitudinally coupled resonator boundary acoustic wave filter portion 120, the pitch of the electrode fingers of each of the narrow pitch electrode finger portions 122A and 124A of the first and third IDTs is less than the pitch of the electrode fingers of each of the narrow pitch electrode finger portions 123A and 123B of the first IDT 123.

Note that in the boundary acoustic wave filter device 100, the boundary acoustic wave propagating direction in each of the first and second longitudinally coupled resonator boundary acoustic wave filter portions is preferably $\psi=20°$, for example, the boundary acoustic wave propagating direction in each of the one-port boundary acoustic wave resonators 130 and 140 is preferably $\psi=10°$, for example, and the boundary acoustic wave propagating direction in each of the one-port boundary acoustic wave resonators 150 and 160 is preferably $\psi=30°$, for example. That is, by differentiating the propagating directions of the boundary acoustic waves, it is possible to set an electromechanical coefficient to an appropriate value.

However, in preferred embodiments of the present invention, it is not always necessary to vary the boundary acoustic wave propagating direction of each of the longitudinally coupled resonator boundary acoustic wave filter portions from the boundary acoustic wave propagating direction of each of the boundary acoustic wave resonators. In addition, it is not always necessary to provide the boundary acoustic wave resonators 130, 140, 150, and 160.

In the longitudinally coupled resonator boundary acoustic wave filter device 100, because the above electrode structure is provided between the unbalanced terminal 106 and the first and second balanced terminals 107 and 108, a band-pass filter having a balance-unbalance conversion function is provided. In the first and second longitudinally coupled resonator boundary acoustic wave filter portions 110 and 120, because the narrow pitch electrode finger portions 112A, 113A, 113B, 114A, 122A, 123A, 123B and 124A are provided, continuity of a portion at which IDTs are located adjacent to each other is enhanced. Thus, an insertion loss in the pass band can be reduced.

This is advantageous because the narrow pitch electrode finger portions are provided as in the case of the surface acoustic wave filter device described in Japanese Unexamined Patent Application Publication No. 2006-87145.

As mentioned above, in the present preferred embodiment, the electrode finger pitch of each of the narrow pitch electrode finger portions 112A, 113A, 113B and 114A of the first longitudinally coupled resonator boundary acoustic wave filter portion 110 is less than the pitch of the electrode fingers of each of the narrow pitch electrode finger portions 122A, 123A, 123B and 124A of the second longitudinally coupled resonator boundary acoustic wave filter portion 120. With this configuration, an unnecessary spurious response in a frequency band that is higher than the pass band is effectively reduced. This will be described with reference to FIG. 3.

Figure 3:
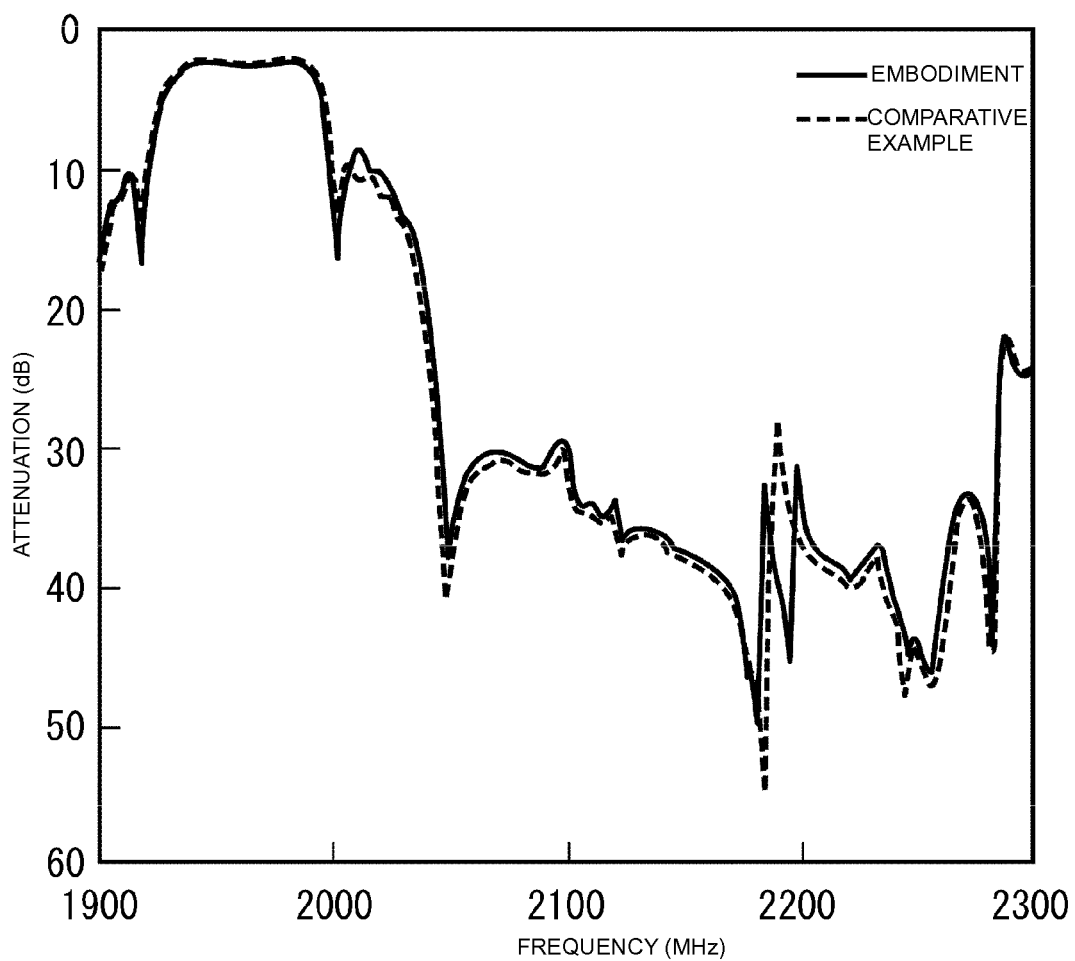
FIG. 3 is a view that shows the filter characteristic of the boundary acoustic wave filter device according to the first preferred embodiment of the present invention and the filter characteristic of a boundary acoustic wave filter device according to a prepared comparative example.

FIG. 3 shows the filter characteristics of the longitudinally coupled resonator boundary acoustic wave filter device according to the present preferred embodiment and the filter characteristics of a boundary acoustic wave filter device according to a comparative example. In the boundary acoustic wave filter device of the present preferred embodiment, the electrode finger pitch λ of the electrode fingers of each IDT other than the narrow pitch electrode finger portions is preferably set to about 1.675 μm, the electrode finger pitch of the electrode fingers of each of the narrow pitch electrode finger portions 112A, 113A, 113B and 114A of the first longitudinally coupled resonator boundary acoustic wave filter portion 110 is preferably set to about 1.46634 μm, and the electrode finger pitch of the electrode fingers of each of the narrow pitch electrode finger portions 122A, 123A, 123B and 124A of the second longitudinally coupled resonator boundary acoustic wave filter portion 120 is preferably set to about 1.48634 μm, for example.

On the other hand, in the boundary acoustic wave filter device according to the comparative example, the electrode finger pitch of each of the narrow pitch electrode finger portions is set to about 1.47634 μm, and the electrode finger pitch of the electrode fingers of each of the remaining main electrode portions is set to about 1.675 μm. Other than this difference, the boundary acoustic wave filter device according to the comparative example is manufactured in a similar manner to the present preferred embodiment. Note that in each of the preferred embodiment and the comparative example, the narrow pitch electrode finger portions 112A, 113A, 113B, 114A, 122A, 123A, 123B, and 124A include three electrode fingers. In FIG. 3, the solid line represents the result of the present preferred embodiment, and the broken line represents the result of the comparative example.

As shown in FIG. 3, around 2190 MHz, which is higher in than about 1930 MHz to about 1990 MHz, which is the PCS receiving band and is the pass band, a large spurious response occurred. In contrast, in the boundary acoustic wave filter device of the present preferred embodiment, it appears that a spurious response around 2190 MHz is significantly reduced and the spurious response is improved by about 3 dB. In addition, it appears that the attenuation around 2190 MHz is improved from about 28.4 dB to about 31.5 dB according to the present preferred embodiment.

As described above, the reason that a spurious response around 2190 MHz is improved may be as follows.

The spurious response is an unwanted mode caused by a Stoneley wave that causes a spurious response against an SH-type boundary acoustic wave. Then, when designing a boundary acoustic wave filter device that utilizes an SH wave, the thickness of an IDT is usually set to a thickness having a relatively small electromechanical coefficient for the Stoneley wave. When the thickness of the IDT is considered, a range in which the electromechanical coefficient for the Stoneley wave is relatively small is set using a numeric value represented by a normalized thickness (=(electrode thickness/electrode interval)). However, because the normalized thickness depends on the pitch of the electrode fingers, at the narrow pitch electrode finger portions, excited Stoneley waves are received at a specific strength. Thus, the above described spurious response occurs.

In contrast, in the present preferred embodiment, the pitch of the electrode fingers of each of the narrow pitch electrode finger portions 112A, 113A, 113B and 114A of the first longitudinally coupled resonator boundary acoustic wave filter portion 110 is different from the pitch of the electrode fingers of each of the narrow pitch electrode finger portions 122A, 123A, 123B and 124A of the second longitudinally coupled resonator boundary acoustic wave filter portion 120. Thus, the spurious responses occur at shifted positions and, therefore, the size of the spurious is reduced.

Thus, according to the present preferred embodiment, it is possible to provide a filter device that is suitable for applications that require that an undesirable spurious response does not occur in a band higher than the pass band, for example, in a transmitting side pass band, such as a PCS receiving band-pass filter.

Note that in the present preferred embodiment, the pitch of the electrode fingers of each narrow pitch electrode finger portion of the first longitudinally coupled resonator boundary acoustic wave filter portion 110 is preferably set to be less than the pitch of the electrode fingers of each narrow pitch electrode finger portion of the second longitudinally coupled resonator boundary acoustic wave filter portion. However, the pitch may be set to be greater than the pitch of the electrode fingers of each narrow pitch electrode finger portion of the second longitudinally coupled resonator boundary acoustic wave filter portion.

Note that in the first preferred embodiment, the pitch of each narrow pitch electrode finger portion of the first longitudinally coupled resonator boundary acoustic wave filter portion is preferably varied from the pitch of the electrode fingers of each narrow pitch electrode finger portion of the second longitudinally coupled resonator boundary acoustic wave filter portion. However, in the first longitudinally coupled resonator boundary acoustic wave filter portion 110, the pitch of the electrode fingers of at least one of the narrow pitch electrode finger portions may be varied from the pitch of the electrode fingers of each of the remaining narrow pitch electrode finger portions, and in the second longitudinally coupled resonator boundary acoustic wave filter portion, the pitch of the electrode fingers of at least one of the narrow pitch electrode finger portions may be varied from the pitch of each of the remaining narrow pitch electrode finger portions That is, as described above, a spurious response that occurs in a filter characteristic is dispersed by the narrow pitch electrode finger portions and the size of the spurious response that occurs in a band higher than the pass band is reduced. Thus, in one longitudinally coupled resonator boundary acoustic wave filter, for example, the pitch of the electrode fingers of each narrow pitch electrode finger portion of the first IDT 113 may preferably be set to be greater or less than the pitch of the electrode fingers of each of the narrow pitch electrode finger portions of the second and third IDTs. Then, in the preferred embodiment in which the first and second longitudinally coupled resonator boundary acoustic wave filter portions are provided, in at least one of the first and second longitudinally coupled resonator boundary acoustic wave filter portions, as described above, the pitch of the electrode fingers of at least one of the narrow pitch electrode finger portions is varied from the pitch of the electrode fingers of each of the remaining narrow pitch electrode finger portions. Thus, it is possible to disperse spurious responses that occur in a high band side to reduce the spurious response.

In addition, according to a modification of the first preferred embodiment, not only the pitches of the electrode fingers of the narrow pitch electrode finger portions can preferably be varied, but also the numbers of electrode fingers can be varied, such that it is possible to disperse and further reduce the spurious response. Thus, in this modification, in which the pitch of the electrode fingers of at least one of the narrow pitch electrode finger portions is varied from the pitch of each of the remaining narrow pitch electrode finger portions, preferably, for example, the number of electrode fingers of each narrow pitch electrode finger portion of the first IDT is also varied from the number of electrode fingers of each narrow pitch electrode finger portion of the second and third IDTs.

However, the number of electrode fingers of each of the narrow pitch electrode finger portions of the first IDT may be equal to the number of electrode fingers of each of the narrow pitch electrode finger portions of the second and third IDTs.

Figure 4:
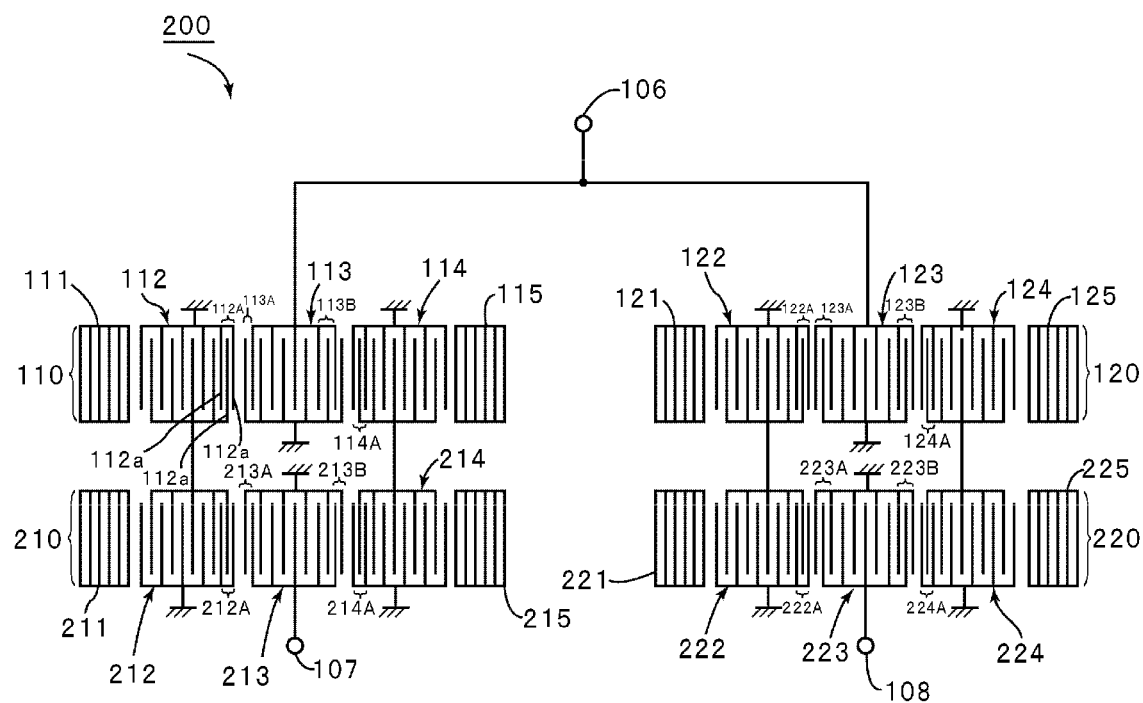
FIG. 4 is a schematic plan view that shows the electrode structure of a boundary acoustic wave filter device according to a second preferred embodiment of the present invention.

FIG. 4 is a schematic plan view that shows the electrode structure of a boundary acoustic wave filter device according to a second preferred embodiment of the present invention.

In the boundary acoustic wave filter device of the first preferred embodiment shown in FIG. 1, the one-port boundary acoustic wave resonators are connected respectively to the preceding stage and following stage of each of the first and second longitudinally coupled resonator boundary acoustic wave filter portions 110 and 120. In the boundary acoustic wave filter device 200 shown in FIG. 4, the first and second longitudinally coupled resonator boundary acoustic wave filter portions 110 and 120 are directly connected to the unbalanced terminal 106. Then, third and fourth longitudinally coupled resonator boundary acoustic wave filter portions 210 and 220 are respectively connected to the following stages of the first and second longitudinally coupled resonator boundary acoustic wave filter portions 110 and 120. The longitudinally coupled resonator boundary acoustic wave filter portions 210 and 220 are preferably three-IDT type longitudinally coupled resonator boundary acoustic wave filter portions, similar to the longitudinally coupled resonator boundary acoustic wave filter portions 110 and 120.

However, the longitudinally coupled resonator boundary acoustic wave filter portions 210 and 220 are configured in substantially the same manner as the first longitudinally coupled resonator boundary acoustic wave filter portion 110. That is, IDTs 212 to 214 in the longitudinally coupled resonator boundary acoustic wave filter portion 210, IDTs 222 to 224 in the longitudinally coupled resonator boundary acoustic wave filter portion 220, and the IDTs 112 to 114 in the first longitudinally coupled resonator boundary acoustic wave filter portion 110 have the same polarity among the corresponding IDTs.

Then, ends of the second and third IDTs 112 and 114 of the first longitudinally coupled resonator boundary acoustic wave filter portion 110 are respectively connected to ends of the second and third IDTs 212 and 214 of the third longitudinally coupled resonator boundary acoustic wave filter portion 210. The other ends of the IDTs 212 and 214 are connected to a ground. One end of the middle first IDT 213 is connected to a ground, and the other end thereof is connected to the first balanced terminal 107. Similarly, ends of the second and third IDTs 222 and 224 of the fourth longitudinally coupled resonator boundary acoustic wave filter portion 220 are respectively connected to the second and third IDTs 122 and 124 of the second longitudinally coupled resonator boundary acoustic wave filter portion 120, and the other ends thereof are connected to a ground. One end of the first IDT 223 is connected to a ground, and the other end thereof is connected to the second balanced terminal 108.

In the longitudinally coupled resonator boundary acoustic wave filter device 200 of the present preferred embodiment, in the third and fourth longitudinally coupled resonator boundary acoustic wave filter portions 210 and 220, narrow pitch electrode finger portions 212A, 213A, 213B, 214A, 222A, 223A, 223B, and 224A are provided at portions at which IDTs are located adjacent to each other. Then, the pitch of the electrode fingers of each of the narrow pitch electrode finger portions 213A, 213B, 212A and 214A is different from the pitch of the electrode fingers of each of the narrow pitch electrode finger portions 223A, 223B, 222A and 224A.

In the boundary acoustic wave filter device 200 of the present preferred embodiment, as in the first preferred embodiment, because the pitches of the electrode fingers of the narrow pitch electrode finger portions are different, a spurious response in a band higher than the pass band is suppressed.

Figure 5:
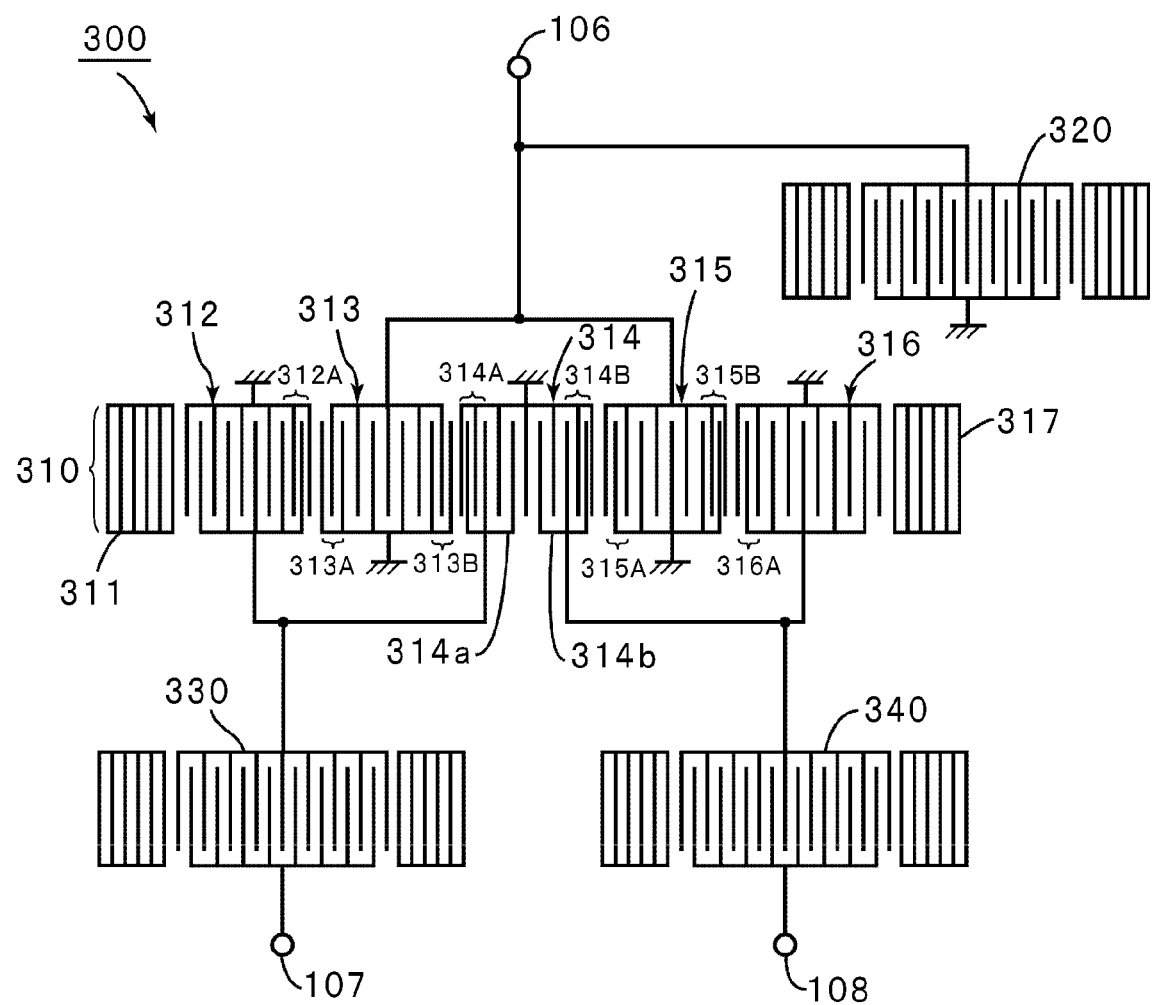
FIG. 5 is a schematic plan view that shows the electrode structure of a boundary acoustic wave filter device according to a third preferred embodiment of the present invention.

FIG. 5 is a schematic plan view that shows the electrode structure of a boundary acoustic wave filter device according to a third preferred embodiment of the present invention.

In the longitudinally coupled resonator boundary acoustic wave filter device 300 according to a third preferred embodiment of the present invention, a five-IDT type longitudinally coupled resonator boundary acoustic wave filter portion 310 is connected to the unbalanced terminal 106. That is, the longitudinally coupled resonator boundary acoustic wave filter portion 310 includes a first IDT 314 that is arranged in the middle in boundary acoustic wave propagating direction. The IDT 314 includes first and second divided IDT portions 314*a* and 314*b* that are separately formed in the boundary acoustic wave propagating direction by dividing one of the bus bars of the IDT 314. Second and third IDTs 313 and 315 are arranged on both sides of the IDT 314 in the boundary acoustic wave propagating direction. Fourth and fifth IDTs 312 and 316 are arranged on both sides of the region in which the IDTs 313 to 315 are provided in the boundary acoustic wave propagating direction. Reflectors 311 and 317 are arranged on both side of the region in which the IDTs 312 to 316 are arranged in the boundary acoustic wave propagating direction. Here, a one-port boundary acoustic wave resonator 320 is connected between the unbalanced terminal 106 and a ground. In addition, ends of the second and third IDTs 313 and 315 of the longitudinally coupled resonator boundary acoustic wave filter portion 310 are commonly electrically connected to the unbalanced terminal 106. The other ends of the IDTs 313 and 315 are connected to a ground.

One end of the fourth IDT 312 and the divided IDT portion 314a are commonly connected to the first balanced terminal 107 via a one-port boundary acoustic wave resonator 330. The other end of the IDT 312 is connected to a ground. In addition, the second divided IDT portion 314b and one end of the fifth IDT 316 are commonly electrically connected to the second balanced terminal 108 via a one-port boundary acoustic wave resonator 340. In addition, the other end of the IDT 316 is connected to a ground. In addition, a common bus bar side of the IDT 314 is connected to a ground.

In the boundary acoustic wave filter device 300 of the present preferred embodiment, at the portion at which the IDTs 312 to 316 are arranged, narrow pitch electrode finger portions 312A, 313A, 313B, 314A, 314B, 315A, 315B and 316A are respectively provided at portions at which IDTs are located adjacent to each other. Thus, balancing is improved.

In addition, the pitch of the electrode fingers of each of the narrow pitch electrode finger portions 314A and 314B of the first IDT 314 is different from the pitch of the electrode fingers of each of the narrow pitch electrode finger portions 313B and 315A of ends of the second and third IDTs 313 and 315, adjacent to the IDT 314. Thus, a spurious response is dispersed due to the narrow pitch electrode finger portions, such that the magnitude of a spurious response in a band higher than the pass band is reduced.

In addition, the pitch of the electrode fingers of each of the narrow pitch electrode finger portions 312A and 316A of the fourth and fifth IDTs 312 and 316 is different from the pitch of the electrode fingers of each of the narrow pitch electrode finger portions 313A and 315B. That is, the pitches of the electrode fingers of the narrow pitch electrode finger portions are varied between any adjacent portions at which IDTs are located adjacent to each other. As described above, all of the pitches of the electrode fingers of the narrow pitch electrode finger portions between any adjacent portions at which IDTs are located adjacent to each other are varied. Thus, a spurious response in a band higher than the pass band is effectively dispersed, such that the spurious response is further reduced.

Note that in the present preferred embodiment, in order to provide a balance-unbalance conversion function, the polarity of the IDT 315 is opposite to the polarity of the IDT 313. However, in the five-IDT type longitudinally coupled resonator boundary acoustic wave filter, the polarity of each of a plurality of IDTs used to provide a balance-unbalance conversion function may be appropriately changed as long as the balance-unbalance converter function is provided.

Figure 6:
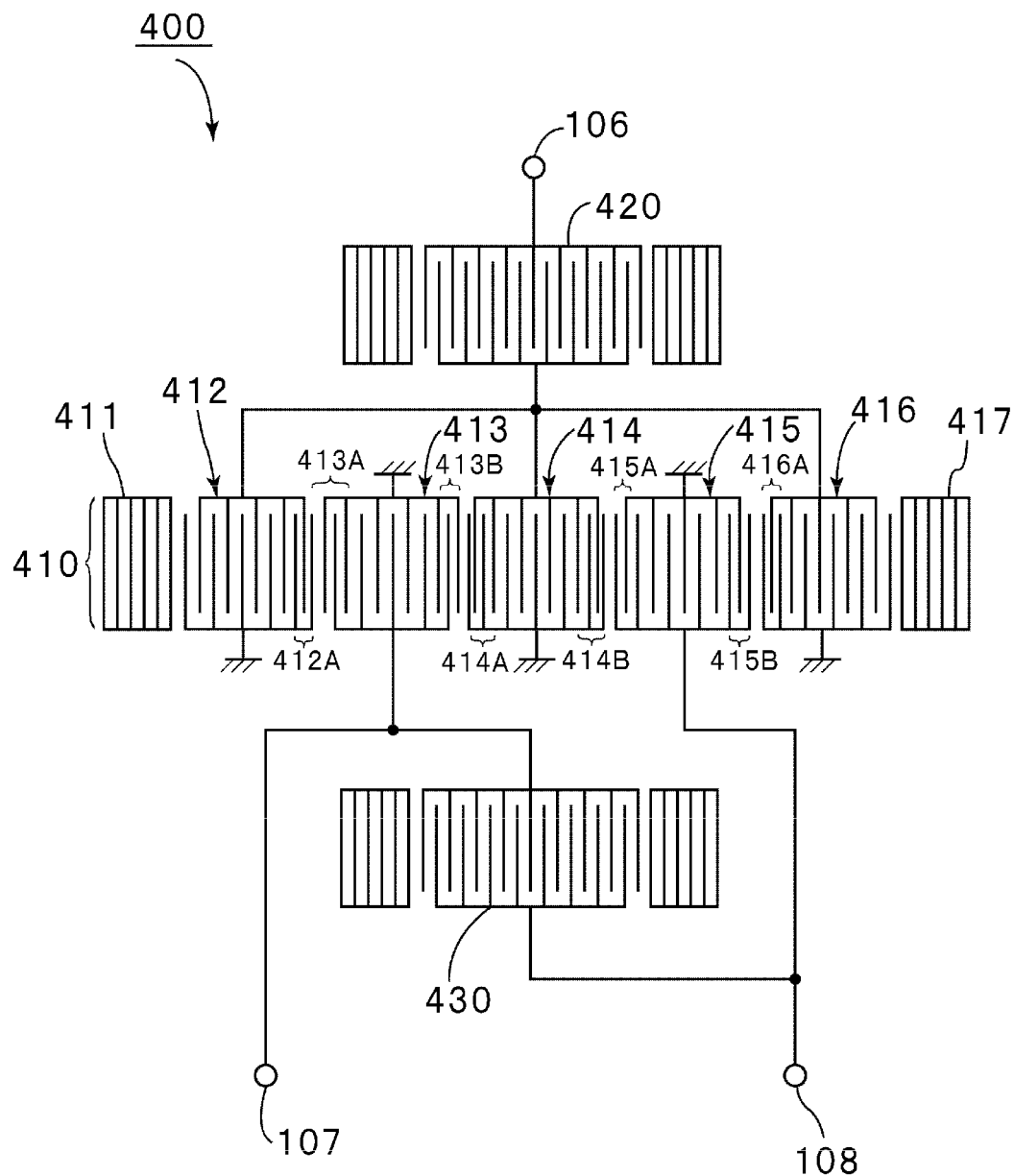
FIG. 6 is a schematic plan view that shows the electrode structure of a boundary acoustic wave filter device according to an alternative example of a preferred embodiment of the present invention.
Figure 7:
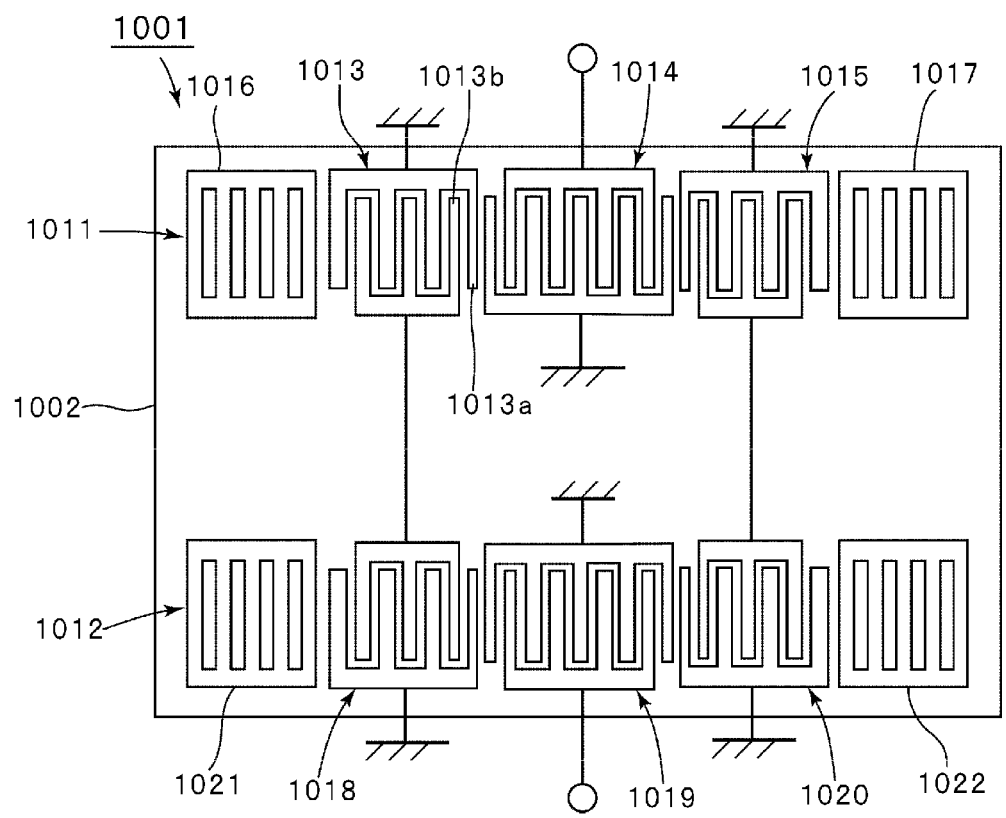
FIG. 7 is a schematic plan view that shows the electrode structure of a known longitudinally coupled resonator surface acoustic wave filter device.

For example, in a boundary acoustic wave filter device 400 according to an alternative example of a preferred embodiment of the present invention as shown in FIG. 6, a five-IDT type longitudinally coupled resonator boundary acoustic wave filter 410 is arranged between the unbalanced terminal 106 and the first and second balanced terminals 107 and 108. Here, the longitudinally coupled resonator boundary acoustic wave filter portion 410 includes a first IDT 414, second and third IDTs 413 and 415, fourth and fifth IDTs 412 and 416, and reflectors 411 and 417. The first IDT 414 is arranged in the middle. The second and third IDTs 413 and 415 are arranged respectively on both sides of the first IDT 414 in the boundary acoustic wave propagating direction. The fourth and fifth IDTs 412 and 416 are arranged in the region in which the IDTs 413 to 415 are provided in the boundary acoustic wave propagating direction.

Then, one end of the first IDT 414 and ends of the fourth and fifth IDTs 412 and 416 are commonly connected to the unbalanced terminal 106 via a one-port boundary acoustic wave resonator 420. A ground is connected to the other ends of the IDTs 412, 414 and 416. The polarity of the third IDT 415 is opposite to the polarity of the second IDT 413. Then, ends of the IDTs 413 and 415 are connected to a ground, the other end of the IDT 413 is connected to the first balanced terminal 107, and the other end of the third IDT 415 is connected to the second balanced terminal 108. Note that a one-port boundary acoustic wave resonator 430 is preferably connected between the first and second balanced terminals 107 and 108.

In the present alternative example, the polarity of the IDT 415 is opposite to the polarity of the IDT 413 such that the balance-unbalance converter function is provided.

In addition, in the present alternative example, narrow pitch electrode finger portions are provided at portions at which IDTs are located adjacent to each other, and the pitches of the electrode fingers of the narrow pitch electrode finger portions are varied between any adjacent portions. More specifically, the first IDT 414 includes narrow pitch electrode finger portions 414A and 414B located at both ends thereof. At a portion at which the first and second IDTs 413 and 414 are located adjacent to each other, the pitch of the electrode fingers of the narrow pitch electrode finger portion 413B provided at an end of the IDT 413, adjacent to the IDT 414, is different from the pitch of the electrode fingers of the narrow pitch electrode finger portion 414A of the IDT 414. Similarly, between the narrow pitch electrode finger portion 412A provided in the IDT 412 and the narrow pitch electrode finger portion 413A of the IDT 413, the pitches of the electrode fingers are varied. In this manner, at the portion at which the narrow pitch electrode finger portions 412A and 413A are located adjacent to each other, at the portion at which the narrow pitch electrode finger portion 413B and the narrow pitch electrode finger portion 414A are located adjacent to each other, at the portion at which the narrow pitch electrode finger portion 414B and the narrow pitch electrode finger portion 415A are located adjacent to each other, and at the portion at which the narrow pitch electrode finger portion 415B and the narrow pitch electrode finger portion 416A are located adjacent to each other, the pitches of the electrode fingers of the adjacent narrow pitch electrode finger portions are varied. With this configuration, a spurious response is dispersed and reduced.

Figure 8:
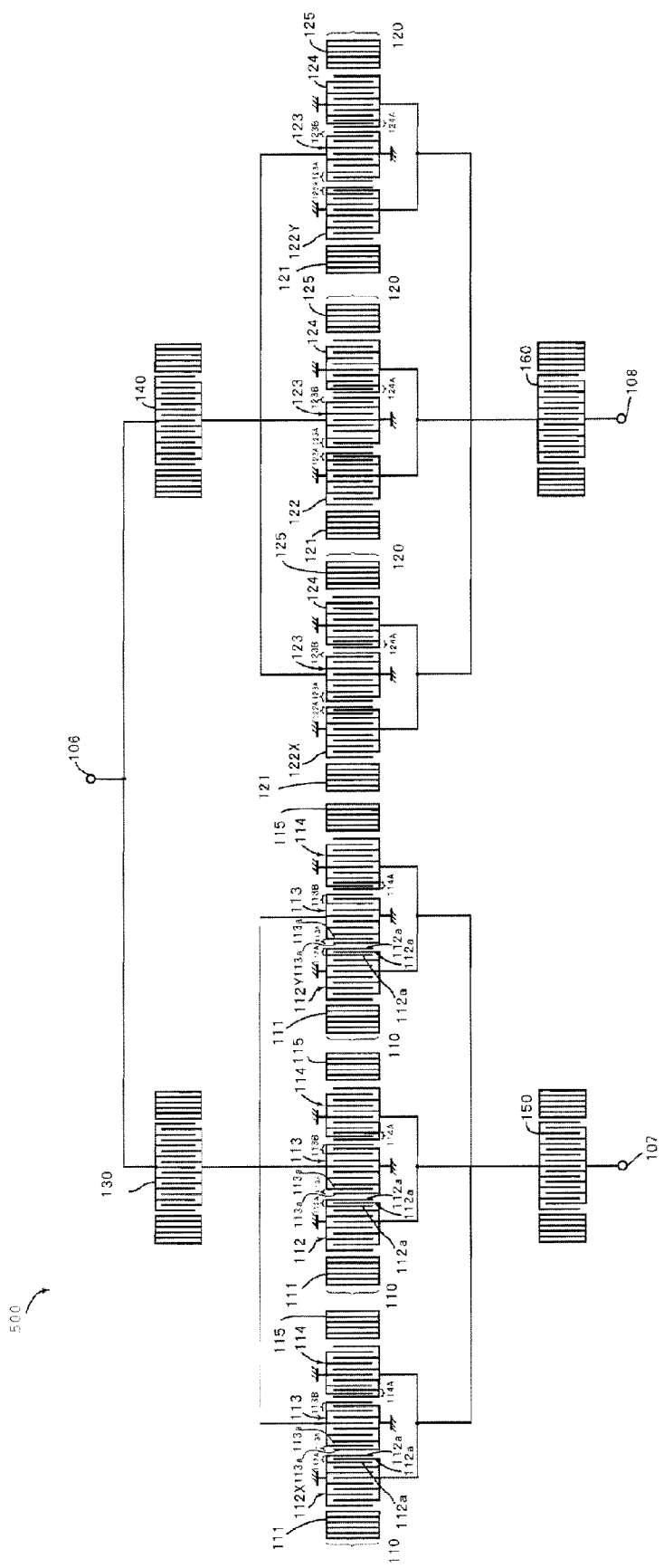
FIG. 8 is a schematic plan view that shows the electrode structure of a boundary acoustic wave filter device according to another preferred embodiment of the present invention.

As shown in FIG. 8, a six-IDT type longitudinally coupled resonator boundary acoustic wave filter 500 according to another preferred embodiment of the present invention is arranged between the unbalanced terminal 106 and the first and second balanced terminals 107 and 108. The longitudinally coupled resonator boundary acoustic wave filter 500 includes third and fifth longitudinally coupled resonator boundary acoustic wave filter portions 112X and 112Y that are configured the same or substantially the same as the first longitudinally coupled resonator boundary acoustic wave filter portion 112, and fourth and sixth longitudinally coupled resonator boundary acoustic wave filter portions 122X and 122Y that are configured the same or substantially the same as the second longitudinally coupled resonator boundary acoustic wave filter portion 122.

Note that in the preferred embodiments and alternative examples, the piezoelectric body is preferably made of $LiNbO_3$ having a principal plane obtained by rotating the Y-axis through about 15 degrees +−10 degrees. However, the piezoelectric body may be made of $LiNbO_3$ having another crystal angle. In addition, a piezoelectric body may be made of another piezoelectric material, such as LiTaO$_3$ or rock crystal, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave filter device comprising:
a piezoelectric body;
a dielectric body laminated on the piezoelectric body; and
an electrode structure arranged at a boundary between the piezoelectric body and the dielectric body; wherein
the boundary acoustic wave filter device utilizes an SH-type boundary acoustic wave that propagates along the boundary;
the electrode structure includes a first IDT, and second and third IDTs that are provided on both sides of the first IDT in a direction in which a boundary acoustic wave propagates to define a longitudinally coupled resonator boundary acoustic wave filter portion;
at portions of the first to third IDTs at which two IDTs are located adjacent to each other, a pitch of a portion of electrode fingers of one IDT located at an end adjacent to another IDT is less than a pitch of another portion of electrode fingers of the one IDT adjacent to that portion, so as to define a narrow pitch electrode finger portion;
the pitch of the electrode fingers of at least one of the narrow pitch electrode finger portions provided in the first IDT and the second and third IDTs is different from the pitch of the electrode finger portions of each of the remaining narrow pitch electrode finger portions;
the number of electrode fingers of each of the narrow pitch electrode finger portions of the first IDT is different from the number of electrode fingers of each of the narrow pitch electrode finger portions of the second and third IDTs; and
the pitch of the electrode fingers of the at least one of the narrow pitch electrode finger portions provided in the first IDT and the second and third IDTs and the pitch of the electrode finger portions of each of the remaining narrow pitch electrode finger portions are selected so as to reduce a spurious response in a frequency band that is higher than a pass band of the boundary acoustic wave filter device.

2. The boundary acoustic wave filter device according to claim 1, further comprising fourth and fifth IDTs, the fourth and fifth IDTs being arranged on both sides of the region in which the first to third IDTs are provided in the direction in which the boundary acoustic wave propagates, so as to define a five-IDT type longitudinally coupled resonator boundary acoustic wave filter portion.

3. A boundary acoustic wave filter device comprising:
a piezoelectric body;
a dielectric body laminated on the piezoelectric body; and
an electrode structure arranged at a boundary between the piezoelectric body and the dielectric body; wherein
the boundary acoustic wave filter device utilizes an SH-type boundary acoustic wave that propagates along the boundary;
the electrode structure includes first and second longitudinally coupled resonator boundary acoustic wave filter portions, each of which includes a first IDT, and second and third IDTs that are arranged on both sides of the first IDT in a direction in which a boundary acoustic wave propagates;
at portions of the first to third IDTs at which two IDTs are located adjacent to each other, a pitch of a portion of electrode fingers of one IDT located at an end adjacent to another IDT is less than a pitch of another portion of electrode fingers of the one IDT adjacent to that portion, so as to define a narrow pitch electrode finger portion;
a polarity of each of the first to third IDTs of the first and second longitudinally coupled resonator boundary acoustic wave filter portions is set such that a phase of an output signal to an input signal of the second longitudinally coupled resonator boundary acoustic wave filter portion is different by about 180 degrees from a phase of an output signal to an input signal of the first longitudinally coupled resonator boundary acoustic wave filter portion;
an unbalanced terminal and first and second balanced terminals are provided, input ends of the first and second longitudinally coupled resonator boundary acoustic wave filter portions are connected to the unbalanced terminal, and output ends of the first and second longitudinally coupled resonator boundary acoustic wave filter portions are respectively connected to the first and second balanced terminals;
the pitch of the electrode fingers of at least one of the narrow pitch electrode finger portions of the first IDT and the second and third IDTs is different from the pitch of the electrode finger portions of each of the remaining narrow pitch electrode finger portions;
for each of the first and second longitudinally coupled resonator boundary acoustic wave filter portions, the number of electrode fingers of each of the narrow pitch electrode finger portions of the first IDT is different from the number of electrode fingers of each of the narrow pitch electrode finger portions of the second and third IDTs; and
the pitch of the electrode fingers of the at least one of the narrow pitch electrode finger portions provided in the first IDT and the second and third IDTs and the pitch of the electrode finger portions of each of the remaining narrow pitch electrode finger portions are selected so as to reduce a spurious response in a frequency band that is higher than a pass band of the boundary acoustic wave filter device.

4. The boundary acoustic wave filter device according to claim 3, wherein each of the first and second longitudinally coupled resonator boundary acoustic wave filter portions further comprises fourth and fifth IDTs, the fourth and fifth IDTs being arranged on both sides of the region in which the first to third IDTs are provided in the direction in which the boundary acoustic wave propagates, so as to define a five-IDT type longitudinally coupled resonator boundary acoustic wave filter portion.

5. The boundary acoustic wave filter device according to claim 3, further comprising:
third and fifth longitudinally coupled resonator boundary acoustic wave filter portions that are configured the same or substantially the same as the first longitudinally coupled resonator boundary acoustic wave filter portion; and
fourth and sixth longitudinally coupled resonator boundary acoustic wave filter portions that are configured the same or substantially the same as the second longitudinally coupled resonator boundary acoustic wave filter portion; wherein input ends of the first to sixth longitudinally coupled resonator boundary acoustic wave filter portions are connected to the unbalanced terminal, output ends of the first, third and fifth longitudinally coupled resonator boundary acoustic wave filter portions are connected to the first balanced terminal, and output ends of the second, fourth and sixth longitudinally coupled resonator boundary acoustic wave filter portions are connected to the second balanced terminal.

6. A boundary acoustic wave filter device comprising:

a piezoelectric body;

a dielectric body laminated on the piezoelectric body; and an electrode structure arranged at a boundary between the piezoelectric body and the dielectric body; wherein the boundary acoustic wave filter device utilizes an SH-type boundary acoustic wave that propagates along the boundary;

the electrode structure includes first and second longitudinally coupled resonator boundary acoustic wave filter portions, each of which includes a first IDT, and second and third IDTs that are arranged respectively on both sides of the first IDT in a direction in which a boundary acoustic wave propagates;

at portions of the first to third IDTs at which two IDTs are located adjacent to each other, a pitch of a portion of electrode fingers of one IDT located at an end adjacent to the other IDT is less than a pitch of another portion of electrode fingers of the one IDT, adjacent to that portion, so as to define a narrow pitch electrode finger portion;

a polarity of each of the first to third IDTs of the first and second longitudinally coupled resonator boundary acoustic wave filter portions is set such that a phase of an output signal to an input signal of the second longitudinally coupled resonator boundary acoustic wave filter portion is different by about 180 degrees from a phase of an output signal to an input signal of the first longitudinally coupled resonator boundary acoustic wave filter portion;

an unbalanced terminal and first and second balanced terminals are provided, input ends of the first and second longitudinally coupled resonator boundary acoustic wave filter portions are connected to the unbalanced terminal, and output ends of the first and second longitudinally coupled resonator boundary acoustic wave filter portions are respectively connected to the first and second balanced terminals;

the pitches of the electrode fingers of the narrow pitch electrode finger portions of the first to third IDTs in the first longitudinally coupled resonator filter portion are equal or substantially equal to one another;

the pitches of the electrode fingers of the narrow pitch electrode finger portions of the first to third IDTs in the second longitudinally coupled resonator filter portion are equal or substantially equal to one another;

the pitch of the electrode fingers of each of the narrow pitch electrode finger portions of the first to third IDTs in the first longitudinally coupled resonator filter portion is different from the pitch of the electrode fingers of each of the narrow pitch electrode finger portions of the first to third IDTs in the second longitudinally coupled resonator filter portion; and for each of the first and second longitudinally coupled resonator boundary acoustic wave filter portions, the number of electrode fingers of each of the narrow pitch electrode finger portions of the first IDT is different from the number of electrode fingers of each of the narrow pitch electrode finger portions of the second and third IDTs; and the pitch of the electrode fingers of each of the narrow pitch electrode finger portions of the first to third IDTs in the first longitudinally coupled resonator filter portion and the pitch of the electrode finger and the pitch of the electrode fingers of each of the narrow pitch electrode finger portions of the first to third IDTs in the second longitudinally coupled resonator filter portion are selected so as to reduce a spurious response in a frequency band that is higher than a pass band of the boundary acoustic wave filter device.

7. The boundary acoustic wave filter device according to claim 6, further comprising:

third and fifth longitudinally coupled resonator boundary acoustic wave filter portions that are configured the same or substantially the same as the first longitudinally coupled resonator boundary acoustic wave filter portion; and fourth and sixth longitudinally coupled resonator boundary acoustic wave filter portions that are configured the same or substantially the same as the second longitudinally coupled resonator boundary acoustic wave filter portion; wherein input ends of the first to sixth longitudinally coupled resonator boundary acoustic wave filter portions are connected to the unbalanced terminal, output ends of the first, third and fifth longitudinally coupled resonator boundary acoustic wave filter portions are connected to the first balanced terminal, and output ends of the second, fourth and sixth longitudinally coupled resonator boundary acoustic wave filter portions are connected to the second balanced terminal.

8. The boundary acoustic wave filter device according to claim 6, wherein each of the first and second longitudinally coupled resonator boundary acoustic wave filter portions further comprises fourth and fifth IDTs, the fourth and fifth IDTs being arranged on both sides of the region in which the first to third IDTs are provided in the direction in which the boundary acoustic wave propagates, so as to define a five-IDT type longitudinally coupled resonator boundary acoustic wave filter portion.

* * * * *